(12) United States Patent
Kato et al.

(10) Patent No.: US 9,040,429 B2
(45) Date of Patent: May 26, 2015

(54) PATTERN FORMATION METHOD

(71) Applicant: Kabushiki Kaisha Toshiba, Tokyo (JP)

(72) Inventors: Hirokazu Kato, Aichi (JP); Ayako Kawanishi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 66 days.

(21) Appl. No.: 13/784,648

(22) Filed: Mar. 4, 2013

(65) Prior Publication Data

US 2014/0087566 A1 Mar. 27, 2014

(30) Foreign Application Priority Data

Sep. 21, 2012 (JP) .................................. 2012-208276

(51) Int. Cl.
 *H01L 21/302* (2006.01)
 *H01L 21/033* (2006.01)

(52) U.S. Cl.
 CPC .................................. *H01L 21/0337* (2013.01)

(58) Field of Classification Search
 USPC .................................. 438/706, 707, 710, 717
 See application file for complete search history.

(56) References Cited

U.S. PATENT DOCUMENTS

| | | | |
|---|---|---|---|
| 6,114,099 A | 9/2000 | Liu et al. | |
| 7,521,094 B1 | 4/2009 | Cheng et al. | |
| 7,851,363 B2 * | 12/2010 | Takeishi et al. | ............... 438/694 |
| 8,129,087 B2 | 3/2012 | Ito | |
| 8,226,838 B2 | 7/2012 | Cheng et al. | |
| 2005/0032268 A1 * | 2/2005 | Nishikawa et al. | ............. 438/99 |
| 2009/0196488 A1 | 8/2009 | Nealey et al. | |

FOREIGN PATENT DOCUMENTS

| | | | | |
|---|---|---|---|---|
| JP | 408316121 A | * | 11/1996 | ............ H01L 21/027 |
| JP | 2008036491 A | | 2/2008 | |
| JP | 2008096596 A | | 4/2008 | |
| JP | 2011018778 A | | 1/2011 | |
| JP | 2012033534 A | | 2/2012 | |
| JP | 2012059802 A | | 3/2012 | |
| JP | 2012061531 A | | 3/2012 | |
| WO | 2011036816 A1 | | 3/2011 | |

OTHER PUBLICATIONS

Stoykovich et al., Directed Assembly of Block Copolymer Blends into Nonregular Device-Orientated Structures, Science 308, 1442 (2005).*
J.Y. Cheng et al; "Simple and Versatile Methods to Integrate Directed Self-Assembly with Optical Lithography Using a Polarity-Switched Photoresist"; American Chemical Society; Jul. 15, 2010.
E.W. Edwards et al; "Dimensions and Shapes of Block Copolymer Domains Assembled on Lithographically Defined Chemically Patterned Substrates"; American Chemical Society; 2007; pp. 90-96.
C.Liu et al; "Towards an all-track 300 mm process for directed self-assembly"; 2011 American Vacuum Society; Oct. 18, 2011.
Benjamen Rathsack et al; "Pattern Scaling with Directed Self Assembly Through Lithography and Etch Process Integration"; Proc. Of SPIE; 2012; vol. 8323 83230B-1.
Japanese Office Action dated Jan. 23, 2015, filed in Japanese counterpart Application No. 2012-208276, 7 pages (with translation).

* cited by examiner

*Primary Examiner* — Reema Patel

(74) *Attorney, Agent, or Firm* — Patterson & Sheridan, LLP

(57) ABSTRACT

A pattern formation method comprises a process of forming a resist pattern with an opening that exposes a first region of a glass film arranged on a substrate through a base film; a process of forming a neutralization film above the glass film; a process of forming a directed self-assembly material layer containing a first segment and a second segment above the glass film; a process of microphase separating the directed self-assembly material layer to form a directed self-assembly pattern containing a first part that includes the first segment and a second part that includes the second segment; and a process of removing either the first part or the second part and using the other as a mask to process the base film.

19 Claims, 6 Drawing Sheets

PATTERN FORMATION METHOD

CROSS-REFERENCE TO RELATED APPLICATION

This application is based upon and claims the benefit of priority from Japanese Patent Application No. 2012-208276, filed Sep. 21, 2012, the entire contents of which are incorporated herein by reference.

FIELD

Embodiments described herein relate generally to a pattern formation method.

BACKGROUND

Conventional lithography techniques used in the manufacturing process of semiconductor devices include the double patterning technique by ArF immersion exposure, EUV lithography, and nano imprints. The conventional lithography techniques have various problems, such as increased costs and decreased throughput caused by the refinement of patterns.

Under such conditions, application of DSA (directed self-assembly) to lithography techniques is expected. Since directed self-assembly is generated by spontaneous energy stability, this enables the formation of patterns with high dimensional accuracy. Especially for technologies using microphase separation of macromolecule block copolymer, periodic structures up to several hundred nanometers (nm) of various shapes may be formed with a simple coating and annealing process. Depending on the composition ratio of the macromolecule block copolymer, spherical shapes, cylindrical shapes, or lamellar shapes may be formed by changing the sizes based on the molecular weight, and a dot pattern, hole or pillar pattern, or a line pattern of various dimensions may be formed on a substrate.

In order to form a desired pattern in a wide range using DSA, a guide to control the generating position of the DSA polymer phase needs to be provided. A physical guide (grapho-epitaxy) has a relief structure with a phase-separation pattern formed on the surface. A chemical guide (chemical-epitaxy) is formed on the lower layer of the DSA material. Based on the surface energy difference, control of the forming position of the microphase separation pattern is achieved.

Several chemical guide formation methods are known; however, many of these guides contain physical steps with sizes up to 10 nm. This physical step makes it difficult to transcribe a microphase separation pattern on the lower layer of the processed film, which causes detrimental effects to the regularity of the phase separation.

DETAILED DESCRIPTION

Embodiments provide a pattern formation method that enables an increase in the flatness of a chemical guide and easily transcribes a microphase separation pattern onto a lower film.

In general, the embodiments are explained below based on the drawings presented in the figures.

According to one embodiment, a pattern formation method includes a process of forming a resist pattern with an opening that exposes a first region of a glass film onto the glass film arranged on a substrate through a film that is used for further processing; a process of forming a neutralization film above the glass film after removing the resist pattern; a process of forming a directed self-assembly material layer containing a first segment and a second segment above the glass film after removing the neutralization film; a process of microphase separating the directed self-assembly material layer to form a directed self-assembly pattern containing a first part that includes the first segment and a second part that includes the second segment; and a process of removing either the first part or the second part and using the other as a mask to process the film.

First Embodiment

The pattern formation method based on the first embodiment will be described with reference to FIG. 1 through FIG. 7.

Figure 1:
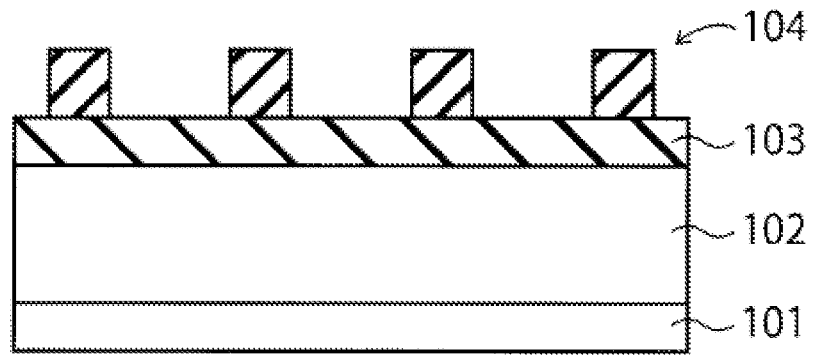
FIGS. 1-7 are cross-sectional views illustrating a sequence of steps of a pattern formation method according to a first embodiment.

First, as shown in FIG. 1, a lower or first film (to-be-processed film) 102 is formed above a substrate 101 by, for instance, forming a SOC (Spin on Carbon) film of film thickness 100 nm using spin coating. Next, a SOG (Spin on Glass film) film 103 (second film) is formed above the processed film 102. The SOG film 103 is a silicon containing material. Then, a resist pattern 104 is formed above the SOG film 103 by, for instance, spin coating a resist to have a film thickness 100 nm, exposing by an argon fluorine (ArF) excimer laser developing it, and processing it into a line-and-space pattern of a pitch of 120 nanometers (nm), and a line width of 60 nm.

Here, it is desired that the surface of the SOG film 103 be hydrophobic and that a pure water (de-ionized water (DIW)) contact angle to be greater than or equal to 76 degrees (°). The contact angle of greater than or equal to 76° here is a contact angle of DIW on the film when the film has a median surface energy between that of a pure block copolymer of polystyrene (PS) film and that of a pure polymethyl methacrylate (PMMA) film. In the present embodiment, an SOG film having a DIW contact angle 83.0° is used. In the process shown in FIG. 1, an ordinary tri-layered resist process may be used to provide low reflectivity.

Figure 2:
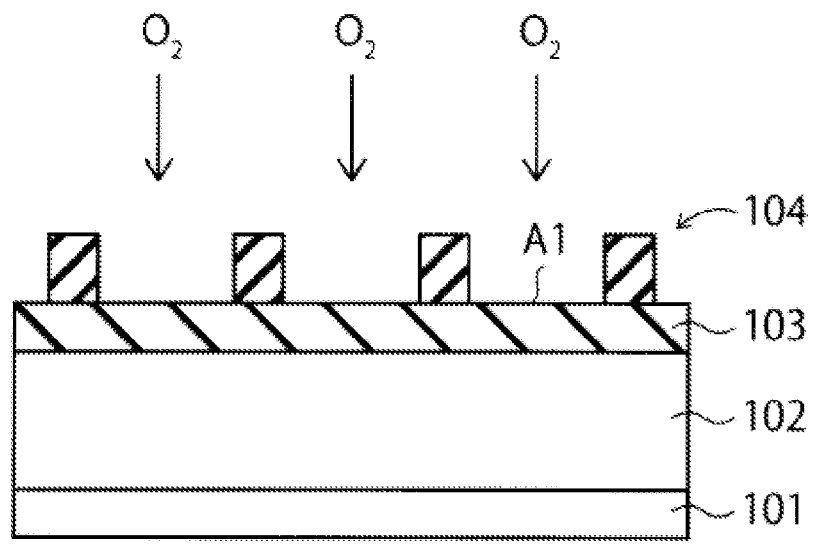

Next, as shown in FIG. 2, an oxygen ($O_2$) plasma treatment is performed on the surface of the resist pattern 104 and SOG film 103. Of the surface of the SOG film 103, a region A1 exposed through an opening of the resist pattern 104 is oxidized with $O_2$ plasma treatment and becomes hydrophilic. Of the surface of the SOG film 103, a part covered with the resist pattern 104 remains hydrophobic. Now, the region A1 of the SOG film 103 is not removed by the $O_2$ plasma treatment. Here, the line width of the resist pattern 104 is narrowed to 45 nm.

Figure 3:
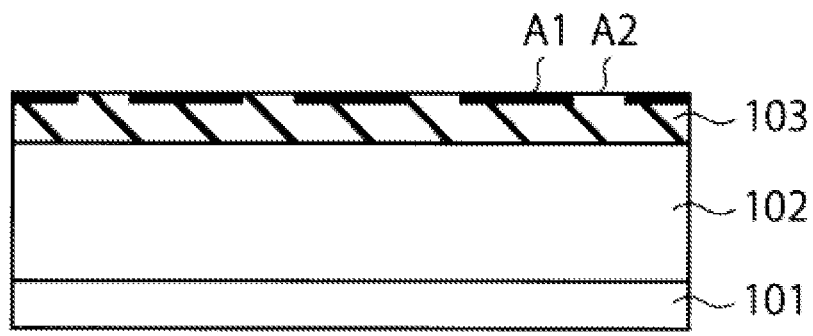

Next, as shown in FIG. 3, organic solvent is used to remove the resist. On the SOG film 103, a region (the region that is a line part of the resist pattern 104) A2 where the resist is removed remained hydrophobic. For instance, the pure water contact angle against the region A1 is 20.3°, and the pure water contact angle against the region A2 is 80.0°.

Figure 4:
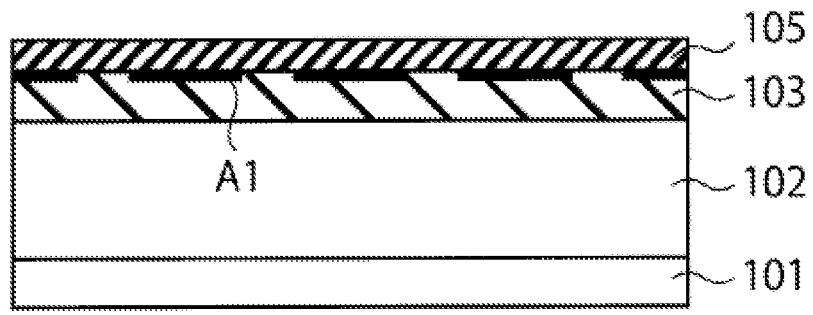

Next, as shown in FIG. 4, a neutralization film material is applied on the SOG film 103, and it is baked to form a neutralization film 105. The neutralization film material may include, for instance, a random copolymer of polystyrene (PS) and polymethyl methacrylate (PMMA) bonded with OH group at the end (P(Sr-MMA)-OH). The neutralization film 105 reacts with the hydrophilic region A1 of the SOG film 103.

Figure 5:
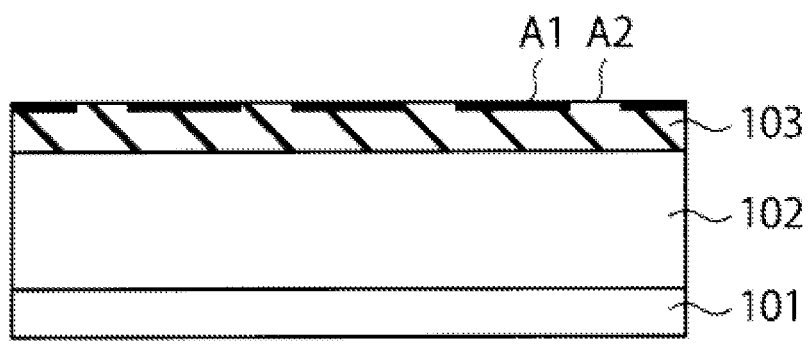

Then, as shown in FIG. 5, the neutralization film 105 is removed. The region A1 of the SOG film 103 is neutralized by reacting with the neutralization film 105. Although the region A2 of the SOG film 103 becomes slightly hydrophilic by reacting with the neutralization film 105, it has a greater hydrophobicity as compared to the region A1. For instance, the pure water contact angle against the region A1 is 76.1°, and the pure water contact angle against the region A2 is 78.8°. When the directed self-assembly material formed in the later process is microphase separated, the SOG film 103 that contains the region A1 (neutral region) and the region A2 (hydrophobic region) functions as a chemical guide layer that controls the formation position of microphase separation pattern and that exhibits a high surface flatness.

Figure 6:
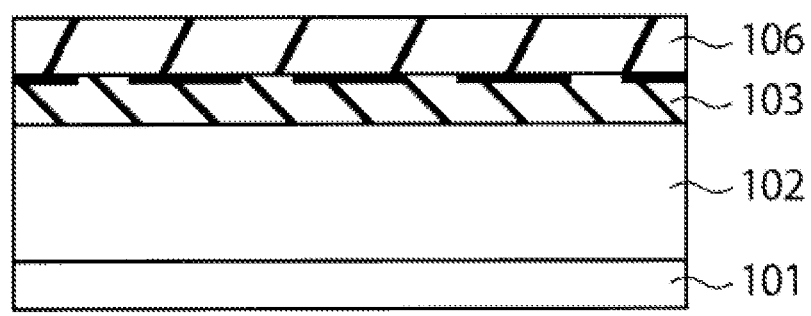

Next, as shown in FIG. 6, the directed self-assembly material is applied above the SOG film 103 to form a directed self-assembly material layer 106. The directed self-assembly material to be applied may be, for instance, a diblock copolymer bonded with a first polymer block chain (first segment) and a second polymer block chain (second segment). As for the diblock copolymer, for instance, block copolymer of polystyrene (PS) and polymethyl methacrylate (PMMA) may be used. For example, a PGMEA solution containing this diblock copolymer of concentration of 1.0 weight percent (wt %) is spin coated on the SOG film 103 at a rate of 1,500 rpm.

Figure 7:
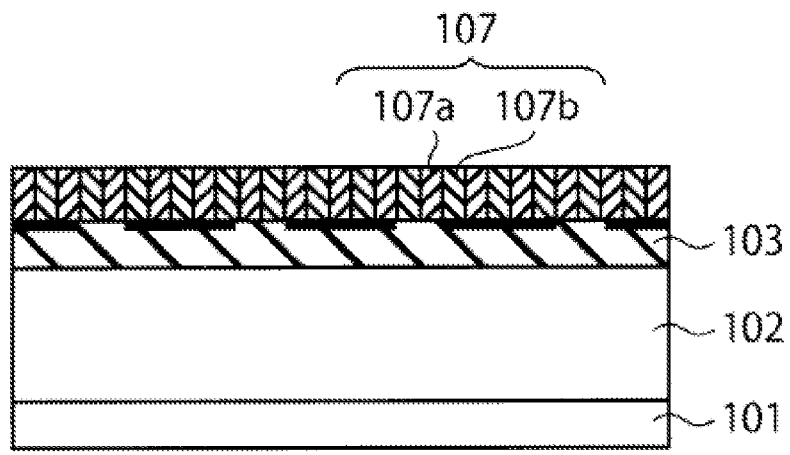

Then, as shown in FIG. 7, the substrate 101 is heated with a hot plate (not shown in figure). With heat, microphase separation occurs in the directed self-assembly material layer 106, which leads to forming, for example, a lamellar directed self-assembly pattern 107 of pitch 30 nm that includes a first polymer part 107a that includes the first polymer block chain and a second polymer part 107b that includes the second polymer block chain.

After that, etching is performed and a line pattern is obtained by using the etching rate difference in PS and PMMA to selectively eliminate the first polymer part 107a or the second polymer part 107b in the directed self-assembly pattern 107 by, for instance, the oxygen plasma treatment. Then, the remaining first polymer part 107a or second polymer part 107b is used as a mask to process the first film 102. As a result, the line pattern is transcribed onto the first film 102.

In the present embodiment, the directed self-assembly material 106 is formed above a chemical guide (SOG film 103) having a high surface flatness. Consequently, a microphase separating pattern may be easily transcribed onto the first film (lower film) 102 that is further processed.

In this embodiment, the resist is narrowed by the $O_2$ plasma treatment shown in FIG. 2. By narrowing the resist, the width of region A2 becomes narrower, as shown in FIG. 3, which will control a formation position gap of the directed self-assembly pattern 107. If, for example, block copolymer of polystyrene (PS) and polymethyl methacrylate (PMMA) is used as the directed self-assembly material, the PS phase will be formed in the region A2 by the microphase separation. By narrowing the width of the region A2, the formation position gap of the PS phase may be controlled. Therefore, it is desired that the resist is to be narrowed so that the width of region A2 is about one-half of an integer times that of the directed self-assembly pattern.

In the process shown in FIG. 2, in place of the $O_2$ plasma treatment, an ozonated water treatment or vacuum-ultraviolet irradiation may be performed to make the region A1 of the SOG film 103 be hydrophilic.

Second Embodiment

The pattern formation method based on the second embodiment will be described with reference to FIG. 8 through FIG. 13.

Figure 8:
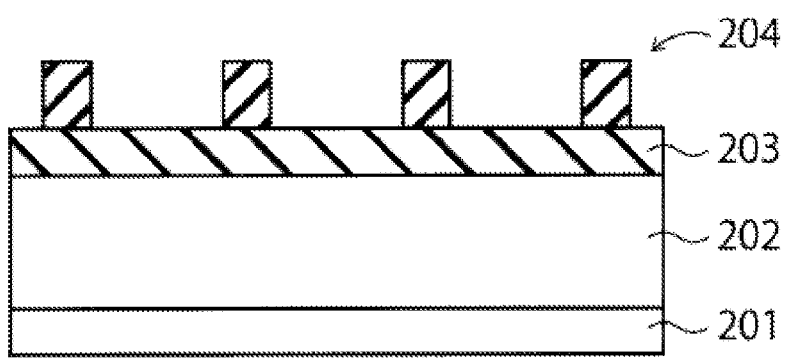
FIGS. 8-13 are cross-sectional views illustrating a sequence of steps of a pattern formation method according to a second embodiment.

First, as shown in FIG. 8, a first film (lower film that is further processed) 202 is formed above a substrate 201 by, for instance, forming the SOC film of film thickness 100 nm using spin coating. Next, a SOG (Spin on Glass) film 203 is formed above the first film 202. Then, a resist pattern 204 is formed above the SOG film 203 by, for instance, spin coating a resist of film thickness 100 nm, exposing it by an ArF excimer laser, developing it and processing it into a line-and-space pattern of a pitch of 120 nm, and a line width of 45 nm.

Here, it is desired that the surface of the SOG film 203 be hydrophobic and that the pure water contact angle be greater than or equal to 76°. In the process shown in FIG. 8, an ordinary 3-layered resist process may be used, which makes it easy to create an antireflection coating design.

Figure 9:
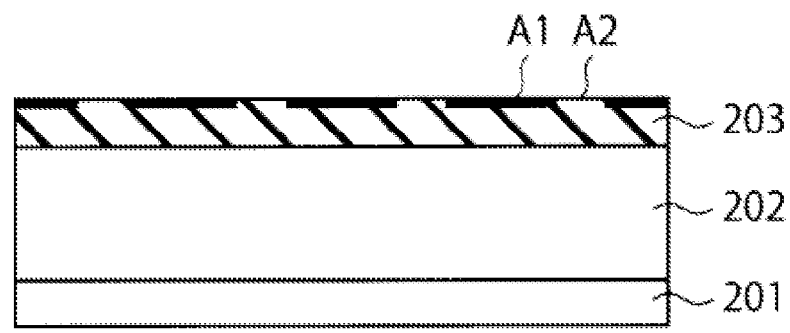

Next, as shown in FIG. 9, an organic solvent is used to remove the resist. On the surface of the SOG film 203, the region A1 exposed through the opening of resist pattern 204 showed minor hydrophilicity; the region (the region that is the line part of the resist pattern 204) A2 where the resist is removed remained hydrophobic. It is thought that this is due to the unprotected resist resin remaining on the SOG film 203. For instance, the pure water contact angle against the region A1 is 76.3°, and the pure water contact angle against the region A2 is 81.9°.

Figure 10:
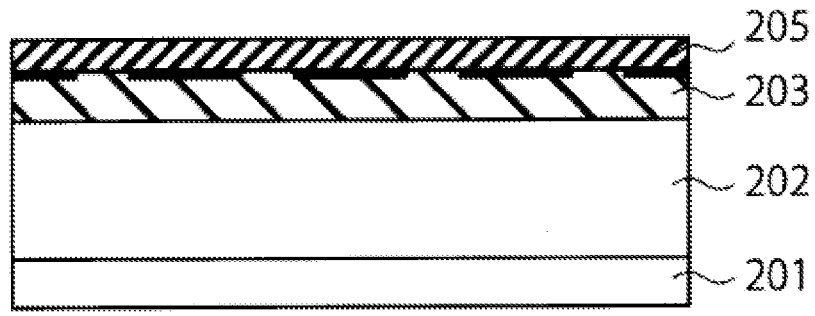

Then, as shown in FIG. 10, a neutralization film material is applied on the SOG film 203, and it is baked to form a neutralization film 205. The neutralization film material may include, for instance, a random copolymer of polystyrene (PS) and polymethyl methacrylate (PMMA) bonded with OH group at the end (P(S-r-MMA)-OH). The neutralization film 205 reacts with the region A1 (hydrophilic region) of the SOG film 203.

Figure 11:
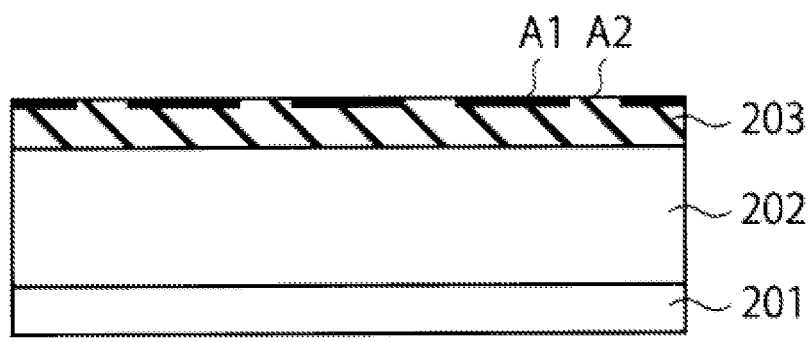

Next, as shown in FIG. 11, the neutralization film 205 is removed. The region A1 of the SOG film 203 is neutralized by reacting with the neutralization film 205. Although the region A2 of the SOG film 203 becomes slightly hydrophilic by reacting with the neutralization film 205, it shows greater hydrophobicity compared to the region A1. For instance, the pure water contact angle against the region A1 is 76.1°, and the pure water contact angle against the region A2 is 78.8°. When the directed self-assembly material formed in the later process is microphase separated, the SOG film 203 that contains the region A1 (neutral region) and the region A2 (hydrophobic region) functions as a chemical guide layer that controls the formation position of microphase separation pattern and that has high surface flatness.

Figure 12:
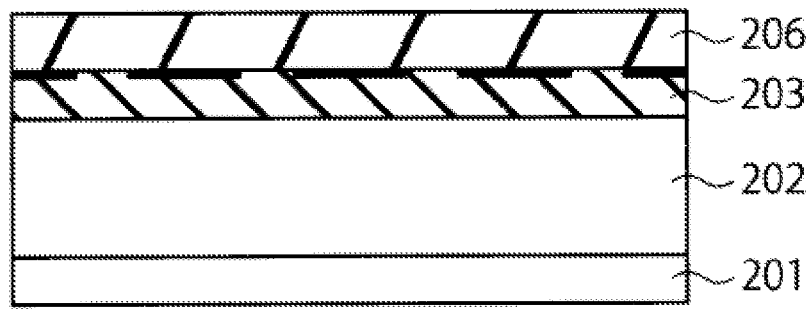

Then, as shown in FIG. 12, a directed self-assembly material is applied above the SOG film 203 to form a directed self-assembly material layer 206. The directed self-assembly material to be applied may be, for instance, a diblock copolymer bonded with the first polymer block chain (first segment) and the second polymer block chain (second segment). As for the diblock copolymer, for instance, block copolymer of polystyrene (PS) and polymethyl methacrylate (PMMA) may be used. For example, a PGMEA solution containing this diblock copolymer of concentration of 1.0 wt % is spin coated on the SOG film 203 at a rate of 1,500 rpm.

Figure 13:
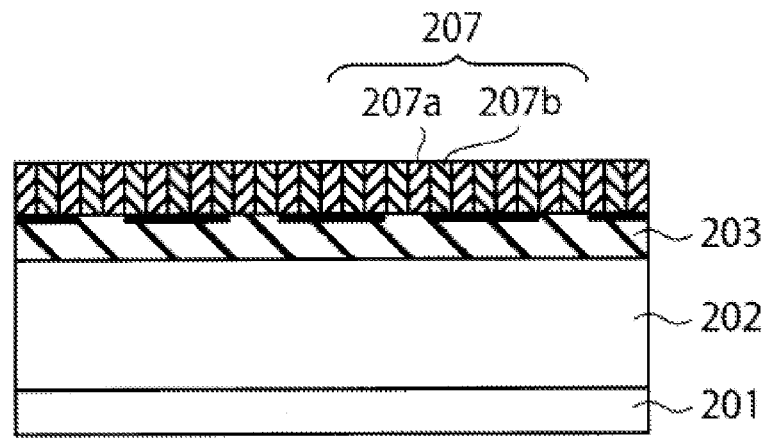

Next, as shown in FIG. 13, the substrate 201 is heated with a hot plate (not shown in figure). With heat, microphase separation occurs in the directed self-assembly material layer 206, which leads to forming, for example, a lamellar directed self-assembly pattern 207 having a pitch of 30 nm that includes a first polymer part 207a that includes the first polymer block chain and a second polymer part 207b that includes the second polymer block chain.

Subsequently, a line pattern is obtained by using the etching rate difference in PS and PMMA to selectively eliminate the first polymer part 207a or the second polymer part 207b in the directed self-assembly pattern 207 by, for instance, an oxygen plasma treatment. Then, the remaining first polymer part 207a or second polymer part 207b is used as a mask to process the first film 202. As a result, a line pattern is transcribed onto the first film 202.

In the present embodiment, the directed self-assembly material 206 is formed above the chemical guide (SOG film 203) having high surface flatness. Consequently, a microphase separating pattern may be easily transcribed onto the first film (lower film) 202.

In addition, compared to the first embodiment, the present embodiment omits the oxidation treatment process (refer to FIG. 2) on the opening of the resist, which simplifies pattern formation.

Third Embodiment

The pattern formation method based on the third embodiment will be described with reference to FIG. 14 through FIG. 17.

Figure 14:
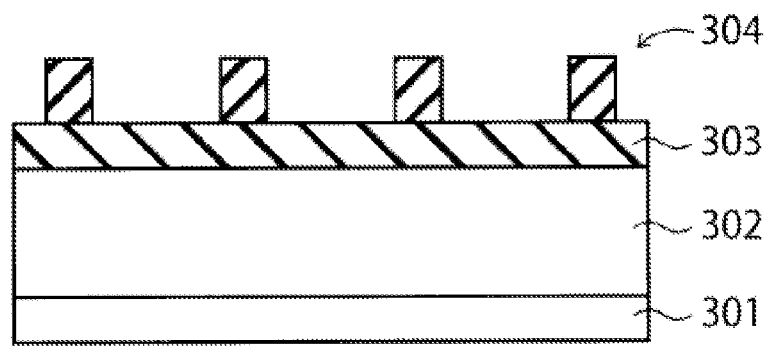
FIGS. 14-17 are cross-sectional views illustrating a sequence of steps of a pattern formation method according to a third embodiment.

First, as shown in FIG. 14, a first film (lower film that is subject to subsequent processing) 302 is formed above a substrate 301 by, for instance, forming a SOC film of film thickness 100 nm using spin coating. Next, a SOG (Spin on Glass) film 303 is formed above the first film 302. Then, a resist pattern 304 is formed above the SOG film 303 by, for instance, spin coating a resist of film thickness 100 nm, exposing by an ArF excimer laser, developing it and processing it into a line-and-space pattern with a pitch of 120 nm, and a line width of 45 nm.

Here, the surface of the SOG film 303 is hydrophobic and a pure water contact angle is greater than or equal to 76°. In addition, the SOG film 303 has a higher hydrophobicity than that of the SOG film 203 in the second embodiment. In the process shown in FIG. 14, an ordinary 3-layered resist process may be used, which makes it easy to create an antireflection coating design.

Figure 15:
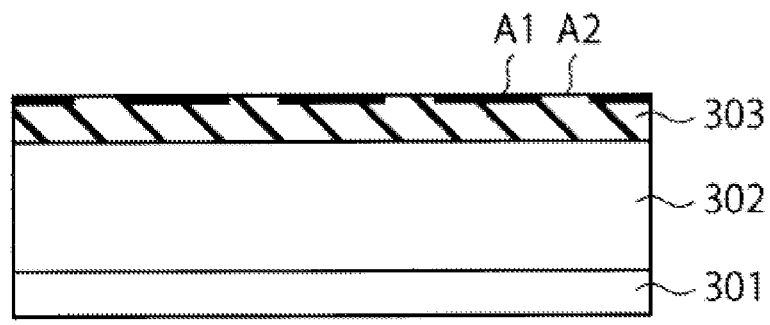

Next, as shown in FIG. 15, an organic solvent is used to remove the resist. On the surface of the SOG film 303, the region A1 exposed through the opening of the resist pattern 304 is neutralized, and the region (the region that is the line part of the resist pattern 304) A2 where the resist is removed remained hydrophobic. It is thought that this is due to the unprotected resist resin remaining on the SOG film 303. For instance, the pure water contact angle against the region A1 is 76.3°, and the pure water contact angle against the region A2 is 81.9°. When the directed self-assembly material formed in the later process is microphase separated, the SOG film. 303 that contains the region A1 (neutral region) and the region A2 (hydrophobic region) functions as a chemical guide layer that controls the formation position of microphase separation pattern and that has high surface flatness.

Figure 16:
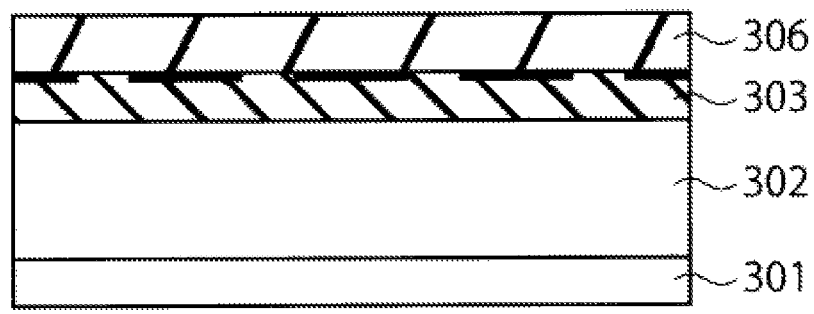

Then, as shown in FIG. 16, a directed self-assembly material is applied above the SOG film 303 to form a directed self-assembly material layer 306. The directed self-assembly material to be applied may be, for instance, a diblock copolymer bonded with the first polymer block chain (first segment) and the second polymer block chain (second segment). As for the diblock copolymer, for instance, block copolymer of polystyrene (PS) and polymethyl methacrylate (PMMA) may be used. For example, a PGMEA solution containing this diblock copolymer of concentration of 1.0 wt % is spin coated on the SOG film 303 at a rate of 1,500 rpm.

Figure 17:
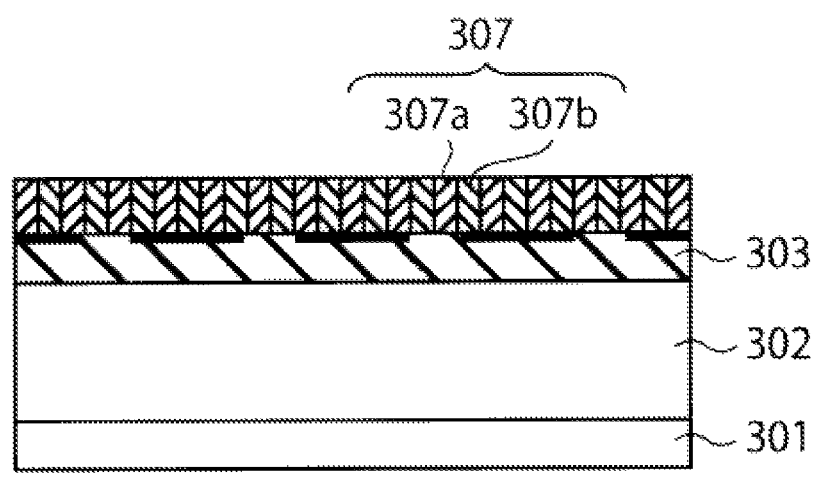

Next, as shown in FIG. 17, the substrate 301 is heated with a hot plate (not shown in figure). With heat, microphase separation occurs in the directed self-assembly material layer 306, which leads to forming, for example, a lamellar directed self-assembly pattern 307 a pitch of 30 nm that includes a first polymer part 307a that includes the first polymer block chain and a second polymer part 307b that includes the second polymer block chain.

Subsequently, a line pattern is obtained by using the etching rate difference in PS and PMMA to selectively eliminate the first polymer part 307a or the second polymer part 307b in the directed self-assembly pattern 307 by, for instance, the oxygen plasma treatment. Then, the remaining first polymer part 307a or second polymer part 307b is used as a mask to process the first film 302. As a result, a line pattern is transcribed onto the first film 302.

In the present embodiment, the directed self-assembly material 306 is formed above the chemical guide (SOG film 303) having high surface flatness. Consequently, a microphase separating pattern may be easily transcribed onto the first film (lower film) 302.

In addition, in the present embodiment, pattern formation may be further simplified as compared to that described in the second embodiment because the formation/removal process of the neutralization film (refer to FIG. 10 and FIG. 11) are omitted.

Although the first to third embodiments explained the example where the resist is processed in a line-and-space pattern, and the directed self-assembly material layer is microphase separated in a lamellar form, the resist pattern form or directed self-assembly material may be changed, and the directed self-assembly material layer may also be microphase separated into a cylindrical form.

While certain embodiments have been described, these embodiments have been presented by way of example only, and they are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A pattern formation method, comprising:
   forming a first layer on a substrate;
   forming a second layer on the first layer;
   forming a resist pattern on the second layer in a line and space pattern, the space pattern having openings that expose a portion of the second layer;
   removing the resist pattern to form a first region and a second region on the second layer, wherein the first region has a greater hydrophobicity than the second region;

forming a neutralization film on the second layer;
removing the neutralization film;
forming a directed self-assembly material layer containing a first segment and a second segment on the second layer after the neutralization film is removed;
microphase separating the directed self-assembly material layer to form a self-assembled pattern containing a first polymer part that includes the first segment and a second polymer part that includes the second segment; and
removing either the first polymer part or the second polymer part, using the other as a mask to process the first layer.

2. The method of claim 1, wherein removing the resist pattern comprises oxidizing the resist pattern.

3. The method of claim 2, wherein removing the resist pattern comprises exposing the resist pattern and the second layer to oxygen plasma.

4. The method of claim 2, wherein removing the resist pattern comprises exposing the resist pattern to ozonated water.

5. The method of claim 2, wherein removing the resist pattern comprises exposing the resist pattern to light in the vacuum-ultraviolet wavelength.

6. The method of claim 1, wherein removing the resist pattern comprises exposing the resist pattern to a solvent.

7. The method of claim 1, wherein the neutralization film alters the hydrophobicity of the first region.

8. The method of claim 7, wherein the neutralization film alters the hydrophobicity of the second region.

9. The method of claim 8, wherein the neutralization film increases the hydrophobicity of the second region.

10. A pattern formation method, comprising:
forming a first film on a substrate;
forming a second film on the first film;
forming resist pattern on the second film, the resist pattern having a line-and-space pattern, wherein a line width is narrower than a space width;
removing the resist pattern to form a first region and a second region on the second film, each of the first region and the second region having different hydrophobic properties;
forming a neutralization film on the second layer;
removing the neutralization film;
forming a directed self-assembly material layer containing a first segment and a second segment on the line and space pattern after the neutralization film is removed;
microphase separating the directed self-assembly material layer to form a pattern containing a first part that includes the first segment and a second part that includes the second segment; and
removing either the first part or second part and using the other as a mask to process the first film.

11. The method of claim 10, wherein removing the resist pattern comprises oxidizing the resist pattern.

12. The method of claim 11, wherein removing the resist pattern comprises exposing the resist pattern to ozonated water.

13. The method of claim 11, wherein removing the resist pattern comprises exposing the resist pattern to light in the vacuum-ultraviolet wavelength.

14. The method of claim 11, wherein removing the resist pattern comprises exposing the resist pattern and the second layer to oxygen plasma.

15. The method of claim 14, wherein the first region corresponds to the space pattern and the second region corresponds to the line pattern, and after removal of the resist pattern, the area of the second region is reduced.

16. The method of claim 10, wherein the neutralization film alters the hydrophobicity of the first region.

17. The method of claim 16, wherein the neutralization film alters the hydrophobicity of the second region.

18. A pattern formation method, comprising:
forming a base film on a substrate;
forming a spin on glass film on the base film;
forming a resist pattern having openings that expose a first region of the glass film;
removing the resist pattern to form second regions adjacent the first region;
forming a neutralization film on the second layer;
removing the neutralization film;
forming a directed self-assembly material layer on the glass film, the directed self assembly material layer containing a first segment and a second segment;
microphase separating the directed self-assembly material layer to form a directed self-assembly pattern containing a first part that includes the first segment and a second part that includes the second segment; and
removing either the first part or the second part and using the other as a mask to process the base film,
wherein:
the first region has a greater hydrophobicity than the second regions.

19. The method of claim 18, wherein the neutralization film alters the hydrophobicity of the first region.

* * * * *